US012622185B2

(12) United States Patent
Senda et al.

(10) Patent No.: US 12,622,185 B2
(45) Date of Patent: May 5, 2026

---

(54) METHOD FOR MANUFACTURING SEMICONDUCTOR SILICON WAFER COMPOSED OF SILICON WAFER SUBSTRATE AND SILICON MONOCRYSTALLINE EPITAXIAL LAYER

(71) Applicant: GLOBALWAFERS JAPAN CO., LTD., Kitakanbara-gun (JP)

(72) Inventors: Takeshi Senda, Kitakanbara-gun (JP); Haruo Sudo, Kitakanbara-gun (JP)

(73) Assignee: GLOBALWAFERS JAPAN CO., LTD., Kitakanbara-gun (JP)

( * ) Notice: Subject to any disclaimer, the term of this patent is extended or adjusted under 35 U.S.C. 154(b) by 412 days.

(21) Appl. No.: 17/760,224

(22) PCT Filed: Feb. 16, 2021

(86) PCT No.: PCT/JP2021/005676
§ 371 (c)(1),
(2) Date: Aug. 5, 2022

(87) PCT Pub. No.: WO2021/166897
PCT Pub. Date: Aug. 26, 2021

(65) Prior Publication Data
US 2023/0073641 A1 Mar. 9, 2023

(30) Foreign Application Priority Data
Feb. 19, 2020 (JP) ................................. 2020-026334

(51) Int. Cl.
*H10P 14/24* (2026.01)
*C23C 16/01* (2006.01)
(Continued)

(52) U.S. Cl.
CPC .............. *H10P 14/24* (2026.01); *C23C 16/01* (2013.01); *C23C 16/24* (2013.01);
(Continued)

(58) Field of Classification Search
CPC ........... H01L 21/0262; H01L 21/02293; H01L 21/02381; H01L 21/02532;
(Continued)

(56) References Cited

U.S. PATENT DOCUMENTS

| | | | |
|---|---|---|---|
| 9,425,264 | B2 | 8/2016 | Kawashima et al. |
| 9,755,022 | B2 | 9/2017 | Kawashima et al. |

(Continued)

FOREIGN PATENT DOCUMENTS

| | | |
|---|---|---|
| CN | 107533959 A | 1/2018 |
| CN | 110603350 A | 12/2019 |

(Continued)

OTHER PUBLICATIONS

Ota, Yusuke. "Silicon molecular beam epitaxy." Thin Solid Films 106.1-2 (1983): 1-136. (Year: 1983).*

(Continued)

*Primary Examiner* — Norman D Richards
*Assistant Examiner* — Ethan Edward Cutler
(74) *Attorney, Agent, or Firm* — BUCHANAN, INGERSOLL & ROONEY PC

(57) ABSTRACT

Provided is a method for manufacturing a semiconductor silicon wafer capable of inhibiting P-aggregation defects (Si—P defects) and SF in an epitaxial layer. The method includes a step of forming a silicon oxide film with a thickness of at least 300 nm or thicker only on the backside of the silicon wafer substrate by the CVD method at a temperature of 500° C. or lower after the step of forming the silicon oxide film, a step of heat treatment where the substrate is kept in an oxidizing atmosphere at a constant temperature of 1100° C. or higher and 1250° C. or lower for 30 minutes or longer and 120 minutes or shorter after the heat treatment, a step of removing surface oxide film formed on the front surface of the substrate, and a step of depositing (Continued)

a silicon monocrystalline epitaxial layer on the substrate after the step of removing the surface oxide film.

2 Claims, 4 Drawing Sheets

(51) Int. Cl.
| | |
|---|---|
| *C23C 16/24* | (2006.01) |
| *H10P 14/20* | (2026.01) |
| *H10P 14/60* | (2026.01) |
| *H10P 95/90* | (2026.01) |

(52) U.S. Cl.
CPC ...... *H10P 14/2905* (2026.01); *H10P 14/3411* (2026.01); *H10P 14/36* (2026.01); *H10P 14/3602* (2026.01); *H10P 14/6349* (2026.01); *H10P 95/90* (2026.01)

(58) Field of Classification Search
CPC ......... H01L 21/02658; H01L 21/02661; H01L 21/324; H01L 21/67063; H01L 21/67075; H01L 21/67115; H01L 21/6723; H01L 21/02016; H01L 21/02019; H01L 21/67219; H01L 21/67248; C23C 16/01; C23C 16/24; C23C 16/02; C30B 25/20; C30B 29/06

See application file for complete search history.

(56) References Cited

U.S. PATENT DOCUMENTS

| | | | | |
|---|---|---|---|---|
| 10,253,429 | B2 | 4/2019 | Nonaka et al. | |
| 2010/0052103 | A1 | 3/2010 | Umeno et al. | |
| 2010/0224968 | A1* | 9/2010 | Kurita ................. | H01L 21/3225 |
| | | | | 257/E21.318 |
| 2010/0288192 | A1 | 11/2010 | Okuuchi | |
| 2013/0025531 | A1* | 1/2013 | Capano ................... | C30B 29/36 |
| | | | | 117/95 |

| | | | | |
|---|---|---|---|---|
| 2014/0001605 | A1* | 1/2014 | Kawashima ...... | H01L 21/02532 |
| | | | | 257/629 |
| 2016/0102418 | A1 | 4/2016 | Narushima et al. | |
| 2018/0087184 | A1 | 3/2018 | Nonaka et al. | |
| 2019/0346447 | A1* | 11/2019 | Wang ................ | H01L 21/26513 |
| 2020/0027727 | A1 | 1/2020 | Nonaka et al. | |

FOREIGN PATENT DOCUMENTS

| | | | |
|---|---|---|---|
| DE | 11 2014 002 133 | T5 | 1/2016 |
| JP | 2010056316 | A | 3/2010 |
| JP | 5845143 | B2 | 11/2015 |
| JP | 2016213232 | A | 12/2016 |
| JP | 2017 5049 | A | 1/2017 |
| JP | 2017005049 | A | 1/2017 |
| JP | 2017088460 | A | 5/2017 |
| JP | 6477210 | B2 | 2/2019 |
| JP | 2019142733 | A | 8/2019 |
| JP | 2019186449 | A | 10/2019 |
| WO | 2009081720 | A1 | 5/2011 |
| WO | 2014175120 | A1 | 10/2014 |

OTHER PUBLICATIONS

Office Action issued on Sep. 24, 2021, in corresponding Taiwanese Patent Application No. 110105595. (4 pages).

Senda et al., "Atomic structures of grown-in Si—P precipitates in red- phosphorus heavily doped CZ-Si crystals", (7p-PB6-5), The 78th JSAP Autumn Meeting, Sep. 5-8, 2017. (3 pages).

Senda et al., "Atomic structures of grown-in Si—P precipitates in red- phosphorus heavily doped CZ Si crystals", (TuP-16), 29th International Conference on Defects in Semiconductors, 2017. (3 pages).

International Search Report (PCT/ISA/210) with English translation and Written Opinion (PCT/ISA/237) mailed on Apr. 20, 2021, by the Japanese Patent Office as the International Searching Authority for International Application No. PCT/JP2021/005676.

Office Action issued on Apr. 26, 2025, by the German Patent office in corresponding German Patent Application 11 2021 001 213.4, and an English Translation of the Office Action. (10 pages).

\* cited by examiner

Fig.1

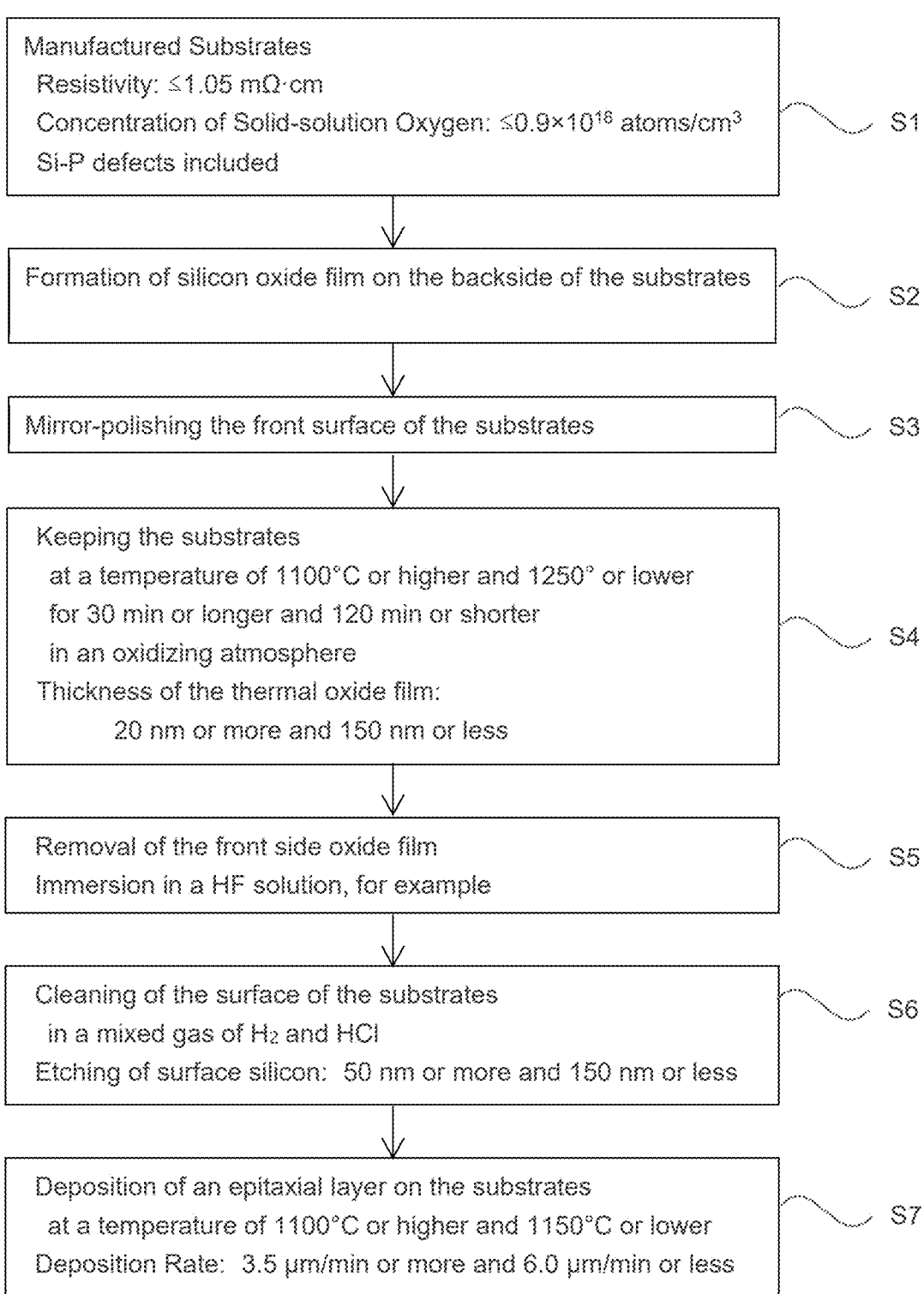

Manufactured Substrates
  Resistivity: ≤1.05 mΩ·cm
  Concentration of Solid-solution Oxygen: $\leq 0.9 \times 10^{18}$ atoms/cm$^3$
  Si-P defects included — S1

Formation of silicon oxide film on the backside of the substrates — S2

Mirror-polishing the front surface of the substrates — S3

Keeping the substrates
  at a temperature of 1100°C or higher and 1250° or lower
  for 30 min or longer and 120 min or shorter
  in an oxidizing atmosphere
Thickness of the thermal oxide film:
      20 nm or more and 150 nm or less — S4

Removal of the front side oxide film
Immersion in a HF solution, for example — S5

Cleaning of the surface of the substrates
  in a mixed gas of H$_2$ and HCl
Etching of surface silicon:  50 nm or more and 150 nm or less — S6

Deposition of an epitaxial layer on the substrates
  at a temperature of 1100°C or higher and 1150°C or lower
Deposition Rate:  3.5 μm/min or more and 6.0 μm/min or less — S7

(a)                                   (b)

METHOD FOR MANUFACTURING SEMICONDUCTOR SILICON WAFER COMPOSED OF SILICON WAFER SUBSTRATE AND SILICON MONOCRYSTALLINE EPITAXIAL LAYER

TECHNICAL FIELD

The present invention relates to a method for manufacturing semiconductor silicon wafers, specifically relates to a method for manufacturing a semiconductor silicon wafer composed of a silicon wafer substrate and a silicon monocrystalline epitaxial layer formed thereon, where the silicon wafer substrate is doped with phosphorus P and has a concentration of solid-solution oxygen adjusted to be $0.9 \times 10^{18}$ atoms/cm$^3$ or less and a resistivity adjusted to be 1.05 mΩ·cm or less.

BACKGROUND ART

The substrate resistivity of the most advanced epitaxial wafer for power MOS devices is 1.00 mΩ·cm or less. To reduce the substrate resistivity further, an increase in dopant concentration is necessary. The n-type dopant species, therefore, are being transitioned from arsenic (As) or antimony (Sb) to phosphorus (P) having relatively low volatility, and its concentration is approximately $1 \times 10^{20}$ atoms/cm$^3$.

As recited in patent literature PTL 1 to PTL 3, growing an epitaxial layer with the increased dopant concentration causes to generate stacking faults (hereinafter also referred to as SF) in an epitaxial layer. In particular, SF are apt to occur in the case of substrates having a resistivity of 1.1 mΩ·cm or less.

It is reported in PTL 1 to PTL 3 that the reason is speculated that the crystal defects originating from the SF are defects due to clusters of phosphorus (P) and oxygen (O). Further, PTLs also report technologies for the inhibition of crystal defects in the processes of heat treatment and epitaxial growth.

Specifically, clusters of phosphorus and oxygen (micro precipitates) are formed when the silicon wafer doped with phosphorus is heated. After that, by performing heat treatment in a hydrogen gas atmosphere (hereinafter referred to as hydrogen baking processing) aiming to remove the natural oxide film on the silicon wafer surface, clusters are selectively etched to become fine pits due to the difference in etching speed between the outermost surface layer of the silicon wafer and the clusters.

The PTL 1 and 2 report that it is speculated that when an epitaxial layer is grown on a silicon wafer where the minute pits are formed, SF originating from the minute pits occurs in the epitaxial layer.

Patent Literature PTL 1 discloses a method for manufacturing an epitaxial silicon wafer including: a step of forming an oxide film on the back surface of a silicon wafer cut out from a single crystal ingot manufactured by the CZ method, a step of removing the oxide film existing on the outer circumference of the silicon wafer, a step of argon annealing in which the silicon wafer is heat-treated at a temperature of 1200° C. or higher and 1220° C. or lower in an argon atmosphere, a step of hydrogen baking process in which the wafer after the argon annealing step is heat-treated for 30 seconds or more and 300 seconds or less at a temperature of 1050° C. or more and 1200° C. or less in a hydrogen atmosphere, and a step of growing an epitaxial layer on the surface of the silicon wafer after the hydrogen baking process. The document PTL 1 further recites that SF in the epitaxial layer can be inhibited by the above method.

PTL 2 also recites, similar to PTL 1, a method for manufacturing an epitaxial silicon wafer that inhibits the occurrence of SF in the epitaxial layer.

CITATION LIST

Patent Literature

PTL 1: Japanese Patent No. 5845143
PTL 2: Japanese Patent No. 6477210

SUMMARY OF INVENTION

Technical Problem

It is clarified through the present inventors' experiments that the countermeasures described in PTL1 and 2 are not sufficient to reduce SF.

In their experiments, monocrystalline silicon wafers with a diameter of 200 mm doped with phosphorus having a resistivity of 0.8 mΩ·cm and oxygen concentration of $0.8 \times 10^{18}$/cm$^3$ grown by the Chzochralski method are heat-treated in an argon atmosphere at 1200° C. for one hour.

Successively, after hydrogen baking at 1180° C. for 60 seconds in a hydrogen atmosphere, an epitaxial layer was grown to a thickness of 3 μm on the wafer surface.

Then the number of LPDs of 90 nm in size or larger is evaluated with SP-1 operated in DCN mode manufactured by KLA-Tencor Corporation, and the density of LPDs originating from SF is at least 10 or more/cm$^2$ was observed; this means not less than 3,140 per wafer.

As is shown above, it is difficult to inhibit the formation even though the concentration of the solid-solution oxygen in the surface layer is sufficiently reduced by the heat treatment under the argon gas atmosphere.

To solve the above problem, the present inventors have intensively studied the inhibition of SF in an epitaxial layer. The present inventors found that when the oxygen concentration in the silicon crystal is $0.9 \times 10^{13}$ atoms/cm$^3$ or less, the type of defects including phosphorus is Si—P aggregation defects (Si—P defects) formed of phosphorus of an atomic % order and silicon.

Further, it is found that P-aggregation defects (Si—P defects) have internal excess Si planes (SF) therein (See non-patent reference documents 4 and 5), and this turns to crystal strains on the substrate surface before deposition of the epitaxial layer, and the strains cause SF which propagate in the epitaxial layer (epi-layer) during the deposition of the epitaxial layer thereafter.

The Si—P defects, as shown in References 4 and 5, are plate-like defects containing silicon and a few atomic percent of phosphorus. Phosphorus atoms reside not at the atomic sites but interstitially and excess silicon atoms (external SF) are also contained.

The phosphorus concentration estimated from the resistivity around the defects is approximately 0.2 atom %, the phosphorus aggregates locally, and the epitaxial layer contains crystal strains.

The non-patent references of NPL 1, NPL 2 are as follows: NPL 1: "Atomic structures of grown-in Si—P defects in red-phosphorus heavily doped CZ Si crystals" (TuP-16), 29th International Conference on Defects in Semiconductors.

NPL 2: "Atomic structures of grown-in Si—P defects in red-phosphorus heavily doped CZ—Si crystals" [7p-PB6-5], The 78th JSAP Autumn Meeting.

This invention is made based on the above findings and objects to provide a method for manufacturing silicon wafers capable of inhibiting P aggregate defects (Si—P defects) and inhibiting SF in an epitaxial layer.

Solution to Problem

The invention made to solve the above problem is a method for manufacturing a semiconductor silicon wafer composed of a silicon wafer substrate and an epitaxial layer to be deposited thereon, which includes a step of forming a silicon oxide film with a thickness of at least 300 nm or thicker only on the backside of the silicon wafer substrate by the CVD method at a temperature of 500C or lower, the silicon wafer substrate being manufactured from a silicon single crystal ingot grown by the Czochralski method, being doped with phosphorus, having resistivity being adjusted to be 1.05 mΩ·cm or less, a concentration of solid-solution oxygen of $0.9 \times 10^{18}$ atoms/cm$^3$ or less, and the front surface of which a silicon monocrystalline epitaxial layer is to be formed on; a step of heat treatment, after the step of forming a silicon oxide film, in which the substrate is kept in an oxidizing atmosphere at a constant temperature of 1100° C. or higher and 1250° C. or lower for 30 minutes or longer and 120 minutes or shorter; a step of removal of surface oxide film, after the step of heat treatment, in which a thermal oxide film formed on the front surface of the substrate; and a step of deposition of a silicon monocrystalline epitaxial layer on the substrate, after the step of removing the surface oxide film.

The method for manufacturing a semiconductor silicon wafer according to the present invention can inhibit SF in an epitaxial layer because the silicon wafer substrate is heat-treated to keep in an oxidizing atmosphere at a constant temperature of 1100° C. or higher and 1250° C. or lower for 30 minutes or longer and 120 minutes or shorter and this can annihilate P-aggregated defects (Si—P defects).

Silicon single crystal is doped with phosphorus and has a resistivity adjusted to 1.05 mΩ·cm or less, equivalent to a phosphorus concentration of $7 \times 10^{19}$ atoms/cm$^3$ or more. To set the concentration of solid-solution oxygen to $0.9 \times 10^{18}$ atoms/cm$^3$ or less in such a crystal is a necessary condition to make the P-aggregated defects into Si—P defects, not into clusters of phosphorus (P) and oxygen (O).

That is, if the condition above is not satisfied, clusters of phosphorus and oxygen are formed and cannot be eliminated even though held at a constant temperature of 1100° C. or higher and 1250° C. or lower for 30 minutes or more and 120 minutes or less in an oxidizing atmosphere.

By setting the concentration of solid-solution oxygen of a silicon single crystal, which is doped with phosphorus and whose resistivity is adjusted to 1.05 mΩ·cm or less (a phosphorus P concentration of $7 \times 10^{19}$ atoms/cm$^3$ or more), to $0.9 \times 10^{18}$ atoms/cm$^3$ or less and causing defects formed by aggregation of phosphorus in the crystal to be Si—P defects, Si—P defects are effectively annihilated by holding the crystal at a constant temperature of 1100° C. or higher and 1250° C. or lower for 30 minutes or longer and 120 minutes or shorter in an oxidizing atmosphere.

The oxidizing atmosphere is an oxygen O$_2$ atmosphere.

It is not preferable because Si—P defects are not sufficiently annihilated when the heat treatment is at a temperature of less than 1100° C. or at a temperature between 1100° C. and 1250° C. for less than 30 minutes and there may be a risk of introducing slip dislocations into the silicon wafer substrate when the heat treatment is at a temperature of higher than 1250° C. or at a temperature between 1100° C. and 1250° C. for more than 120 minutes.

The reason why the Si—P defects are annihilated is speculated as follows: when the crystal is heat-treated in an oxidizing atmosphere and the surface of the silicon wafer substrate is oxidized, interstitial silicon atoms appear at the interface between the surface oxide film SiO$_2$ and crystal silicon, or bulk silicon, in order to relieve the stress generated in the interface.

This causes the interstitial silicon atoms to be supersaturated in the silicon substrate, which is a state where silicon atoms exist more densely than the thermal equilibrium density. When the interstitial silicon atoms are in a supersaturated state, the diffusion speed of phosphorus that diffuses due to the interstitial mechanism increases. (See S. T. Dunham and N. Jeng: Appl. Phys. Lett., 59, 2016 (1991).) With the utilization of this effect, the annihilation of Si—P defects is accelerated because the concentration of phosphorus is apt to decrease due to out-diffusion at the surface.

Further, the method of manufacturing a semiconductor silicon wafer according to the present invention includes a step of forming an oxide film with a thickness of at least 300 nm by the chemical vapor deposition (CVD) method at a temperature of 500° C. or lower only on the backside of the silicon wafer substrate before the heat treatment step.

This is to prevent resistivity anomalies (auto-doping) from occurring in the deposited epitaxial layer due to the desorption of phosphorus from the backside of the substrate during subsequent deposition of silicon epitaxial layer.

A CVD oxide film thus deposited, however, is generally low-density silicon dioxide, has micropores, contains moisture, and has unsatisfactory film quality though deposited thickly at a relatively low temperature.

When a silicon wafer substrate having such a CVD oxide film is heat-treated in a non-oxidizing atmosphere such as argon gas, argon gas penetrates the micropores, the oxide film is etched to form gaps between the oxide film and silicon interface. Consequently, this causes deterioration in not only the adhesiveness of the film but also the hazing of the substrate surface due to the sublimation of moisture.

In contrast, when the silicon wafer substrate is heat-treated in an oxidizing atmosphere, oxygen gas penetrates the micropores and fills them by forming thermal oxide films and densifies the CVD oxide film. Further, there is no risk of deterioration of the hazing on the substrate surface due to the formation of oxide film on the substrate surface even though moisture sublimates from the CVD oxide film.

For this reason, a silicon oxide film is formed with a thickness of at least 300 nm by the chemical vapor deposition (CVD) method at a temperature of 500° C. or lower only on the backside of the silicon wafer substrate, and the substrate is heat-treated in an oxidizing atmosphere at a constant temperature of 1100° C. or higher and 1250° C. or lower for 30 minutes or longer and 120 minutes or shorter.

Then, after the oxide film formed on the front side of the silicon wafer substrate is removed, a silicon monocrystalline epitaxial layer is deposited.

It is desirable that the silicon wafer substrate sliced from the silicon single crystal ingot has Si—P defects formed by the aggregation of phosphorus during the growth of the silicon single crystal ingot and the Si—P defects have a maximum side length less than 100 nm and the density thereof is of less than $1 \times 10^{12}$/cm$^3$.

It is necessary that the Si—P defects have a maximum side length of less than 100 nm and the density thereof is less than $1 \times 10^{12}/cm^3$ to inhibit the SF originating from the Si—P defects.

There is a threshold in the size and density of Si—P defects for Si—P defects in the silicon wafer substrate to be revealed as SF (detected as LPD: Light Point Defect) after epitaxial layer growth.

It is not preferable because Si—P defects in the silicon wafer substrate are revealed as SF when Si—P defects have a maximum side length of 100 nm or more or the density thereof is $1 \times 10^{12}/cm^3$ or more.

The density of phosphorus in the region from the substrate surface to the depth of 300 nm is preferably $7 \times 10^{19}/cm^3$ in the silicon wafer substrate after being heat-treated in an oxidizing atmosphere.

By controlling the concentration of phosphorus to be $7 \times 10^{19}/cm^3$ in the silicon wafer substrate after being heat-treated in the oxidizing atmosphere, the maximum side length of Si—P defects in the region from the substrate surface to the depth of 300 nm can be made to be less than 100 nm and the density thereof to be less than $1 \times 10^{12}/cm^3$.

Therefore, it is preferable because SF is not generated even though an epitaxial layer is deposited on the substrate surface if the density of phosphorus in the region from the substrate surface to the depth of 300 nm is at least $7 \times 10^{19}/cm^3$ or less.

The thickness of the thermal oxide film formed on the surface of the substrate in the heat treatment step in the oxidizing atmosphere is preferably 20 nm or more and 150 nm or less.

The thickness of the thermal oxide film can be controlled by adjusting the partial pressure of oxygen gas.

After the heat treatment, though the removal of the thermal oxide film on the surface is necessary for forming the epitaxial layer, the removal of only the surface oxide film requires multiple processing steps and is costly.

For this reason, by controlling the thickness of the thermal oxide film formed on the substrate surface to be 20 nm or more and 150 nm or less, when the whole substrate is immersed in a dilute hydrofluoric solution containing 0.5% hydrogen fluoride, for example, 300 nm or more in thickness of the CVD oxide film on the backside of the substrate can be left, even though the thermal oxide on the front side surface is completely stripped.

If the thickness of the thermal oxide film is less than 20 nm, the in-plane uniformity of the thermal oxide film is poor and active oxidation occurs on the Si substrate surface in some areas, resulting in gas-etching to roughen the surface, which is undesirable.

Further, the thermal oxide film with a thickness of more than 150 nm is not desirable because it is hard to leave the CVD oxide film with a thickness of 300 nm or more on the backside of the substrate when immersed in a diluted hydrofluoric solution.

After the removal step of the surface oxide film of the substrate, the surface of the front side of the substrate is desirably removed by 50 nm or more to 150 nm or less before the deposition step of an epitaxial layer. This step aims to correct the surface roughness of the wafer after the heat treatment and remove the scorched adherent particles during the heat treatment. The yield of the epitaxial growth step improves by removing the surface of the front side of the substrate in a range from 50 nm or more to 150 nm or less before the deposition step of an epitaxial layer.

Advantageous Effects of Invention

The object of the present invention is to provide a method for manufacturing semiconductor silicon wafers, which is capable of inhibiting the generation of P-aggregation defects (Si—P defects) and inhibiting SF in epitaxial layers.

BRIEF DESCRIPTION OF DRAWINGS

FIG. 1 is a flowchart of an embodiment of a manufacturing method according to the present invention;

FIG. 3(a) is a photograph of the backside of a silicon wafer substrate and FIG. 3(b) is a partially enlarged photograph of the photograph in FIG. 3(a);

DESCRIPTION OF EMBODIMENTS

Embodiments of a manufacturing method of semiconductor silicon wafers according to the present invention will be described based on FIGS. 1 and 2. The embodiment shown below is an example, and the present invention is not limited thereto.

The silicon wafer substrate used in a manufacturing method of semiconductor silicon wafers according to the present invention is a substrate sliced from a silicon single crystal ingot grown by the Czochralski method. The substrate is doped with phosphorus, is adjusted to have a resistivity of 1.05 mΩ·cm or less, equivalent to a phosphorus concentration of $7 \times 10^{19}$ atoms/cm$^3$, and adjusted to have a solid-solution oxygen concentration of $0.9 \times 10^{18}/cm^3$, and contains Si—P defects. (Step S1)

The substrate is prepared by growing a silicon single crystal by the Czochralski method, when fabricating the silicon single crystal ingot, the temperature gradient is made large to inhibit a constitutional supercooling phenomenon and to inhibit the generation of P-aggregation defects (Si—P defects) by forcibly cooling the crystal with a water cooler installed inside the pulling-up furnace, pulling up at a pulling-up speed of 0.5 mm/min or more and 1.0 mm/min or less, and applying a magnetic field of 2000 G or more and 4000 G or less.

Figure 6:
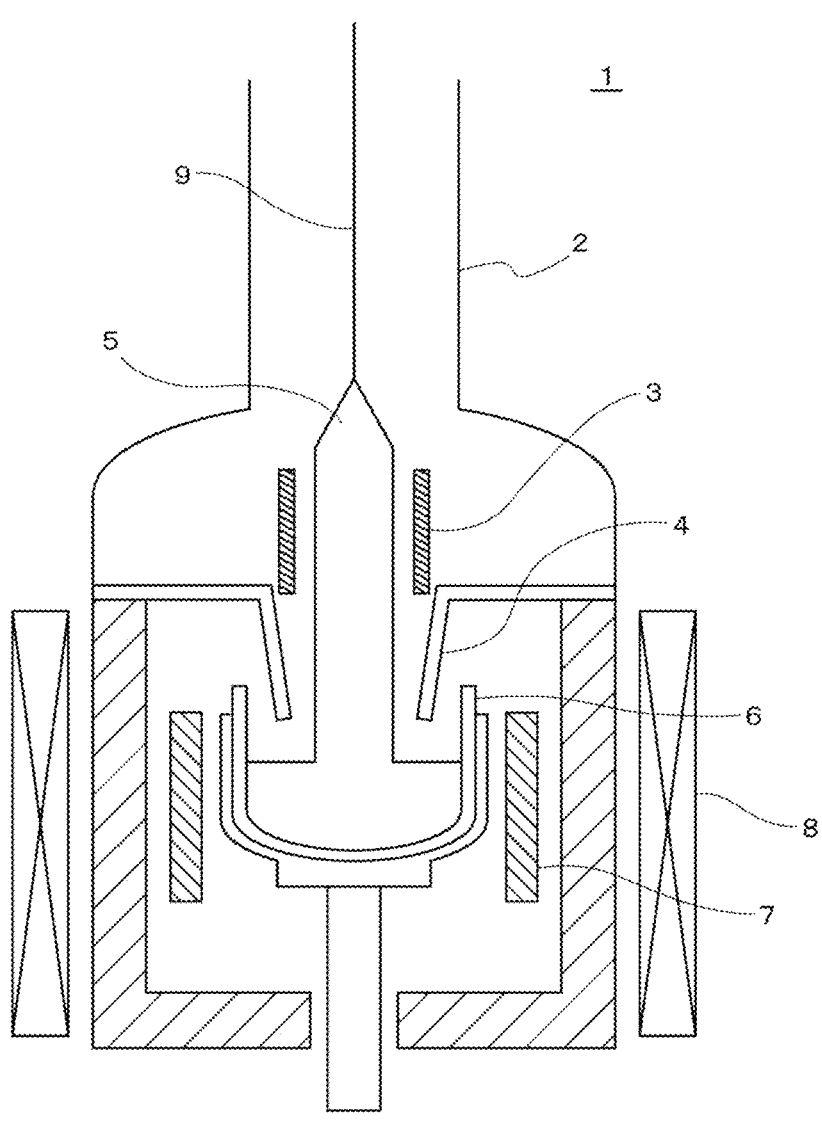
FIG. 6 is a schematic structural diagram of a pulling-up apparatus provided with a water cooler.

Specifically, for example, a pulling-up apparatus 1 shown in FIG. 6 can be used; in the pulling-up apparatus 1, a cylindrical water cooler 3 is installed between the upper part of the pulling-up furnace 2 and a shield plate 4, and the water cooler 3 cools the silicon single crystal S being pulled up forcibly. In the drawings, referential numeral 6 denotes a quartz glass crucible, referential numeral 7 denotes a heater, referential numeral 8 denotes a magnetic field application unit, and referential numeral 9 denotes a wire for pulling up a silicon single crystal.

Further, the substrate is preferably manufactured by slicing a silicon single crystal ingot such that the slicing angle against the primary plane orientation falls in a range of 0.1 degrees to 0.4 degrees. The slicing angle affects the growth and annihilation of SF at the deposition of an epitaxial layer. The principal plane orientation is Si (100), and the slicing angle against the primary plane orientation falls in a range of 0.1 degrees to 0.4 degrees.

Namely, by setting the slicing angle to be in a range of 0.1 degrees to 0.4 degrees against the principal plane orientation, a silicon step terrace is formed that would be a path for the movement of silicon atoms during epitaxial layer formation. By the formation of the step terraces, silicon atoms can move, strains of silicon atoms are eliminated, and SF defects are annihilated. Due to the formation of the silicon step terrace, silicon atoms can move along the terrace. The movement allows the removal of the strains of the silicon atoms and the elimination of the SF.

As described above, the manufactured silicon wafer substrates have a resistivity of 1.05 mΩ·cm or less and the solid-solution oxygen concentration of $0.9 \times 10^{18}$ atoms/cm$^3$ or less and contain Si—P defects that are essentially defects formed by aggregation of phosphorus in the crystal (Step S1). Silicon wafer substrates demanded in the technical field have a resistivity of 1.05 mΩ·cm or less, the solid-solution oxygen concentration of $0.9 \times 10^{18}$ atoms/cm$^3$ or less. Though Si—P defects are inhibited by the above-described method of silicon wafer substrates, Si—P defects still remain.

The above values of the resistivity and the solid-solution oxygen concentration can be achieved by adjusting the dopant concentration, the pulling-up speed, and the magnetic field intensity.

The Si—P defects of thus prepared silicon wafer substrates desirably have less than 100 nm in side length and the concentration of the defects less than $1 \times 10^{12}$/cm$^3$.

When the maximum side length of the Si—P defects is 100 nm or more, Si—P defects reveal as SF (LPD) after the formation of the epitaxial layer. Also when the density of the Si—P defects is $1 \times 10^{12}$/cm$^3$ or more, Si—P defects reveal as SF (LPD) after the step of deposition of an epitaxial layer.

Therefore, it is desirable that the maximum side length of the Si—P defects is less than 100 nm, the density of the Si—P defects is less than $1 \times 10^{12}$/cm$^3$, and the crystal growth so adjusted is desirably performed.

Next, a silicon oxide film is formed on the back surface of the silicon wafer substrate (Step S2). For power MOSFET devices, a silicon oxide film is generally formed on the back surface of the wafer, and the silicon oxide film is formed by low-temperature CVD at a temperature less than 500° C., for example. The silicon oxide film is formed to a thickness of at least 300 nm only on the backside of the wafer. This silicon oxide film is for suppressing resistivity anomalies (auto-doping) in an epitaxially grown layer due to the phosphorus desorption from the backside of the wafer substrate when the silicon epitaxial layer is to be deposited thereafter.

The CVD oxide film, however, is generally low-density silicon dioxide, has micropores, contains much moisture, and has poor film quality.

However, when the silicon wafer substrate is heat-treated in an oxidizing atmosphere in the subsequent steps, oxygen gas penetrates the micropores and fills them by forming thermal oxide films, and densifies the CVD oxide film. Further, there is no risk of deterioration of the hazing on the substrate surface due to the formation of oxide film on the substrate surface even though moisture evaporates from the CVD oxide film.

Subsequently, the front surface of the wafer substrate is mirror-polished. (Step S3)

Mirror-polishing is carried out by pressing and rotating the wafer substrate surface to a polishing cloth with flowing a slurry containing silica particles. The reason why the mirror-polishing is performed in step S3 is also the removal of damages that are caused to the surface of the wafer by coming into contact with the protecting tape when the silicon oxide film is deposited on the backside of the wafer. The mirror-polishing does not decrease the Si—P defects.

Then, the wafer substrate is kept at a temperature of 1100° C. or higher and 1250° C. or lower for 30 minutes or longer and 120 minutes or shorter. (Step S4)

The atmosphere in the furnace for the heat treatment is an oxidizing atmosphere, or oxygen gas O$_2$, specifically. Consequently, a thermal oxide film is formed on the surface of the wafer substrate by the heat treatment to a thickness of 20 nm or thicker and 150 nm or less. The thickness of the thermal oxide film is controlled by adjusting the partial pressure of the oxidizing gas of oxygen O$_2$.

The Si—P defects are effectively annihilated by keeping the substrate at a temperature of 1100° C. or higher and 1250° C. or lower for 30 minutes or longer and 120 minutes or shorter. As a result, SF defects in the epitaxial layer are inhibited. It is not desirable to keep the substrate at less than 1100° C. or for less than 30 minutes because Si—P defects cannot be sufficiently annihilated, and keep the substrate at more than 1250° C. or for longer than 120 minutes because there may be a risk of introducing slip dislocations into the substrate.

When the thickness of the thermal oxide film is less than 20 nm, it is not desirable because the in-plane uniformity of the thermal oxide film is poor and gas etching occurs due to active oxidization in some parts of the silicon wafer substrate.

In contrast, when the thickness of the thermal oxide film is more than 150 nm, it is not desirable because the CVD oxide film on the backside of the substrate cannot leave 300 nm or more in the removal process of the front surface oxide film.

Next, the oxide film on the front surface of the substrate is completely removed by an acidic solution or acidic atmosphere. (Step S5)

By controlling the thermal oxide film thickness on the surface of the wafer substrate by the heat treatment described above to a thickness of 20 nm or thicker and 150 nm or less, by immersing the entire substrate in a dilute hydrofluoric solution with an HF concentration of 0.5%, for example, the thermal oxide film on the front surface of the substrate is completely removed but the CVD oxide film on the backside of the substrate remains 300 nm or more.

The process of removing the oxide film is desirably included because not only for the cleaning of the silicon surface but also for the annihilation of Si—P defects the removal of the surface natural oxide film is necessary.

In addition to immersing the entire substrate in a dilute hydrofluoric solution with an HF concentration of 0.5%, the surface natural oxide film may be removed by an acidic atmosphere such as hydrogen chloride HCl.

In addition, the surface cleaning treatment is performed on the substrate prior to the epitaxial layer deposition process. (Step S6).

In the surface cleaning treatment step, silicon on the surface is etched by 50 nm or more to 150 nm or less by a mixed gas of hydrogen Hz and hydrogen chloride HCl.

SP after the epitaxial layer deposition can be further reduced by performing surface cleaning treatment. The defects removal by hydrogen chloride gas HCl is effective and a mixed gas of hydrogen H$_2$ and hydrogen chloride HCl as a carrier is desirably employed.

The depth of the remaining defects is approximately 100 nm or less at the finish of step 4. Thus, the etching depth of surface silicon to 50 nm or more and 150 nm or less is appropriate if the productivity is considered.

Subsequently, a monocrystalline silicon epitaxial layer is deposited to a thickness of 1.3 μm or more and 10.0 μm or less. The silicon deposition temperature is 1100° C. or higher and 1150° C. or lower and the deposition rate is 3.5 μm/min or more and 6.0 μm/min or less. (Step S7)

As a result of studies, it is found that there is an appropriate combination of the growth rate and temperature for monocrystalline silicon epitaxial layer depoition for the reduction of SF. It is found that LPDs can be inhibited by setting the silicon deposition temperature to 1100° C. or higher and 1150° C. or lower and the deposition rate to 3.5 μm/min or more and 6.0 μm/min or less.

As an example specifically, a silicon wafer substrate was prepared by slicing a 200 mm diameter single crystal silicon ingot with the crystal orientation of (001) grown by the Czochralski method. An oxide film was formed on the backside of the silicon wafer substrate. The wafer substrate was mirror-polished and heat-treated in an oxidizing atmosphere. The removal of the oxide film on the front surface and the surface cleaning treatment was applied.

The single crystal doped with red phosphorus was pulled up at a pulling-up speed of 0.8 mm/min while applying a magnetic field of 3000 G. The wafer substrate has a resistivity of 0.80 mΩ·cm and a concentration of oxygen of $0.8 \times 10^{18}$ atoms/cm$^3$, and the slicing angle is 0.3 degrees.

In addition, an oxide film was deposited on the backside of the substrate by CVD at 500° C. The front surface of the substrate was mirror-polished by mechanical polishing using silica slurry and a polishing cloth. Then the substrate was heat-treated in an oxygen O$_2$ gas atmosphere and immersed in a diluted HF solution with a concentration of 0.5% to remove the thermal oxide film formed on the front side thoroughly. Further, an epitaxial layer was deposited to a thickness of 4 μm in a mixed gas atmosphere of hydrogen H$_2$ and silicon hydrogen chloride SiHCl$_3$ at a deposition rate of 4 μm/min at 1150° C.

Deposition of the silicon film is performed by the movement of silicon atoms on atomic steps on the surface. In this process, SF can be inhibited by correcting the disorder in the arrangement of silicon atoms originating from Si—P defects by the motion of silicon atoms. Therefore, to achieve both the silicon deposition and the correction, the condition of the deposition temperature to be 1100° C. or higher and 1150° C. and the deposition rate to be 3.5 μm/min or more and 6.0 μm/min or lower is necessary.

DESCRIPTION OF EMBODIMENTS

The present invention will be described further in detail based on Examples and Comparative Examples. The invention is not limited to the embodiments.

Experiment 1

Silicon wafer substrates with a diameter of 200 mm were used, which are doped with phosphorus (P) and have a resistivity adjusted to 1.05 mΩ·cm or less and a concentration of solid-solution oxygen adjusted to $0.9 \times 10^{18}$ atoms/cm$^3$ or less.

An oxide film of 300 nm was deposited on the backside of the substrates by CVD at 500° C. The front surface of the substrates was mirror-polished by mechanical polishing using silica slurry and a polishing cloth.

Next, the substrates were heat-treated in an oxygen O$_2$ gas atmosphere at temperatures of 1050° C., 1100° C., 1200° C., 1250° C., and 1270° C. kept for 15 minutes, 30 minutes, 120 minutes, and 180 minutes at each temperature, and immersed in a diluted HF solution with a concentration of 0.5% to remove the thermal oxide film formed on the front side thoroughly. Further, an epitaxial layer was deposited to a thickness of 4 μm in a mixed gas atmosphere of hydrogen H$_2$ and silicon hydrogen chloride SiHCl$_3$ at a deposition rate of 4 μm/min at 1150° C.

After the deposition of the epitaxial layer, the number of LPDs of not less than 65 nm in size existing on the surface was measured with SP1 manufactured by KLA-Tencor Corporation. FIG. 2 shows the results.

Figure 2:
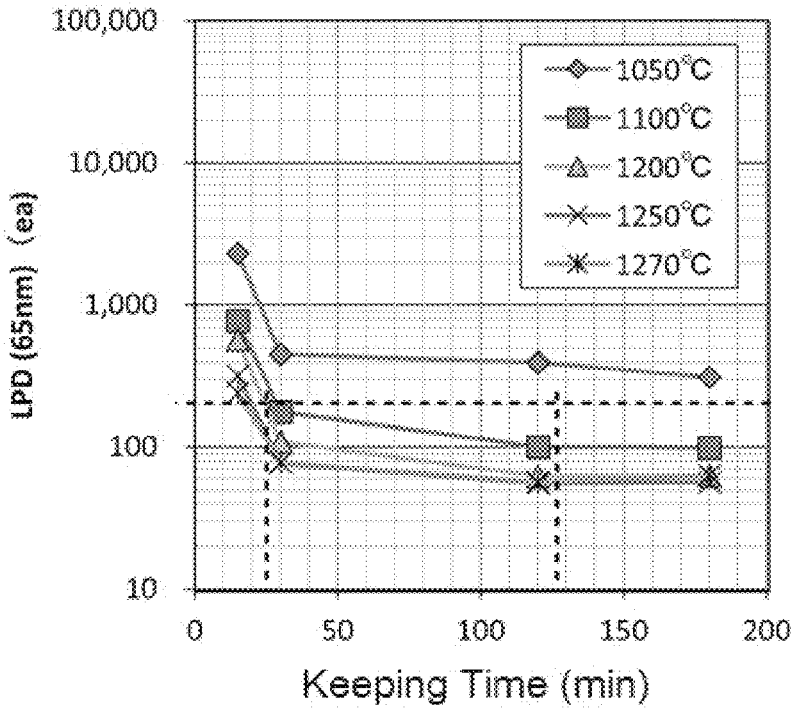
FIG. 2 shows the results of Experiment 1, illustrating a relationship between keeping time and the number of LPDs (65 nm)

As shown in FIG. 2, when processed at temperatures 1100° C. to 1270° C. and kept for 30 minutes to 120 minutes as a keeping time, the number of LPDs is equal to or less than 200 which is the criterion for judgment.

As shown in FIG. 2, for example, the graph lines at temperature 1270° C. and at temperature 1250° C. overlap each other, and above the temperature of 1250° C., the graph lines remained almost flat and unchanged.

Experiment 2

Verification of the thermal oxide films was conducted for the case the oxidizing atmosphere in Experiment 1 was changed to an Ar atmosphere.

Figure 3:
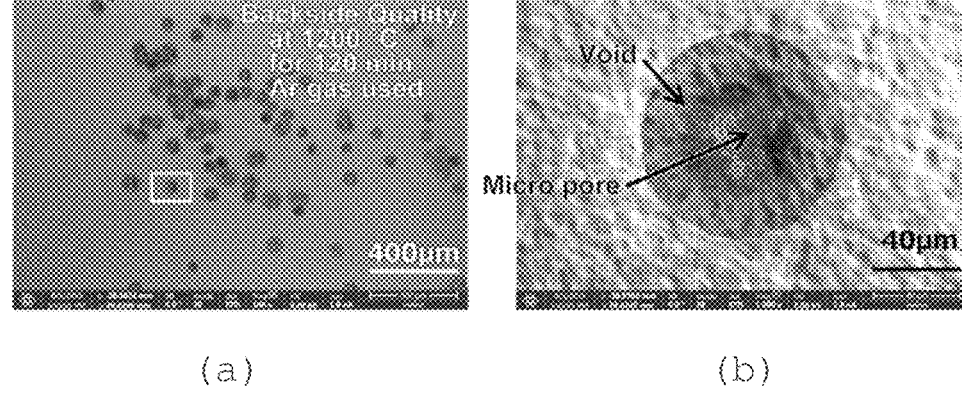
FIGS. 3(a) and 3(b) show the results of Experiment 2.

The heat treatment condition is in an argon Ar atmosphere at 1200° C. for 120 minutes. As shown in FIGS. 3(a) and 3(b), for the case of the argon atmosphere, argon gas penetrates the micropores on the backside CVD film and etches the silicon substrate.

As a result, voids are formed, which is not preferable because voids may be a cause of particles adhering to the front surface side and auto doping of phosphorus, during the epitaxial layer deposition.

FIGS. 3(a) and 3(b) show the results of Experiment 2, and FIG. 3(a) is a photograph of the backside of a silicon wafer substrate and FIG. 3(b) is a partially enlarged photograph of the photograph in FIG. 3(a).

Experiment 3

The thickness of the backside oxide film that is necessary to prevent auto-doping during the epitaxial layer deposition was verified.

Specifically, silicon wafer substrates with a diameter of 200 mm were used, which are doped with phosphorus (P) and have a resistivity adjusted to 1.05 mΩ·cm or less and a concentration of solid-solution oxygen adjusted equal to $0.9 \times 10^{18}$ atoms/cm$^3$ or less.

Next, backside oxide films were formed by the CVD method at 500° C., each having a thickness of 200 nm, 250 nm, 300 nm, 350 nm, and 400 nm.

Then, the front surface of the substrates was mirror-polished mechanically using silica slurry and a polishing cloth. Thereafter, heat treatment was conducted in an oxygen O$_2$ atmosphere at a temperature of 1200° C. for 120 minutes. Further, the thermal oxide film formed on the front surface was completely removed by immersing in diluted hydrogen fluoride (HF) solution with a concentration of 0.5%. Then an epitaxial layer was deposited to a thickness of 4 μm at a deposition rate of 4 μm/min at 1150° C. in an atmosphere composed of hydrogen H$_2$ and trichlorosilane SiHCl$_3$.

Then the auto-doping of phosphorus into the epitaxial layer was examined by the measurement of spreading resistance analysis. Table 1 shows the results.

As shown in Table 1, it is found that the thickness of the backside oxide film of 300 nm or more can prevent the auto-doping of phosphorus into the epitaxial layer.

11

TABLE 1

| Residual Backside Oxide thickness (nm) | Auto-doping of Phosphorus into Epitaxial layer |
|---|---|
| 200 | Yes |
| 250 | Yes |
| 300 | No |
| 350 | No |
| 400 | No |

Experiment 4

Silicon crystals whose concentration of solid-solution oxygen is $0.9 \times 10^{18}$ atoms/cm$^3$ or less with the varied sizes of Si—P defects and density levels were prepared by varying the amount of doped phosphorus in the crystals from $7 \times 10^5$ atoms/cm$^3$ to $1.3 \times 10^{20}$ atoms/cm$^3$ and controlling the growth conditions.

Figure 4:
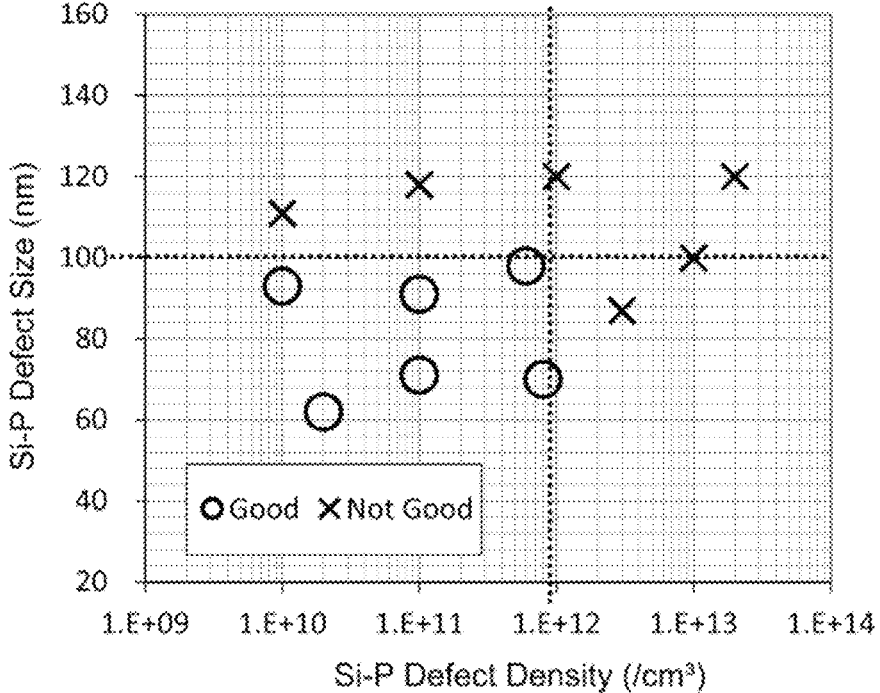
FIG. 4 shows the results of Experiment 4, illustrating a relationship between the size of Si—P defects and the density of Si—P defects.

The size and the density of the Si—P defects were measured by cross-sectional observation using a transmission electron microscope (TEM). FIG. 4 shows the results. The number of LPDs on the surface with a size of 65 nm or larger was inspected using SP-1 manufactured by KLA-Tencor. If the number of LPDs is equal to or less than 200, the result of the inspection is rated "Good" and if more than 200, it is rated "Not Good."

As shown in FIG. 4, the case where the size of the Si—P defects is less than 100 nm and the concentration is less than $1 \times 10^{12}$/cm$^3$ gives the rating of "Good". All the crystals rated "Good" have a phosphorus concentration of $7 \times 10^{19}$ atoms/cm$^3$ or less in common. That is, it is found that when the phosphorus concentration is $7 \times 10^{19}$ atoms/cm$^3$ or less, the size of Si—P defects is less than 100 nm and density thereof is less than $1 \times 10^{12}$/cm$^3$ and the generation of Si—P defects is inhibited.

Experiment 5

Silicon wafer substrates with a diameter of 200 mm were used, which are doped with phosphorus (P) of $1.3 \times 10^{20}$ atoms/cm$^3$ and have a resistivity of 0.6 mΩ·cm and a concentration of solid-solution oxygen of $0.9 \times 10^{28}$ atoms/cm$^3$ or less, and a backside oxude film was formed by the CVD method to a thickness of 300 nm at 500°.

Then, the front surface of the substrates was mirror-polished mechanically using silica slurry and a polishing cloth. Thereafter, heat treatment was conducted in an argon Ar or oxygen O$_2$ atmosphere at 1200° C. for 120 minutes. Further, the thermal oxide film formed on the front surface was completely removed by immersing in diluted hydrogen fluoride (HF) solution with a concentration of 0.5%.

Then an epitaxial layer was deposited to a thickness of 4 μm at a deposition rate of 4 μm/min at 1150° C. in an atmosphere composed of hydrogen H$_2$ and trichlorosilane SiHCl$_3$.

As a result of the inspection of the number of LPDs on the surface with a size of 65 nm or larger using SP-1 manufactured by KLA-Tencor after the deposition of an epitaxial layer, the number of LPDs exceeds 200 for the case of heat treatment with argon Ar but is less than 200 for oxygen O$_2$.

Regarding the reason for the difference in the number of LPDs after the epitaxial layer deposition between the oxygen case and the argon case, this depends on the profile of the concentration of phosphorus in the depth direction from the surface, as described below.

12

Figure 5:
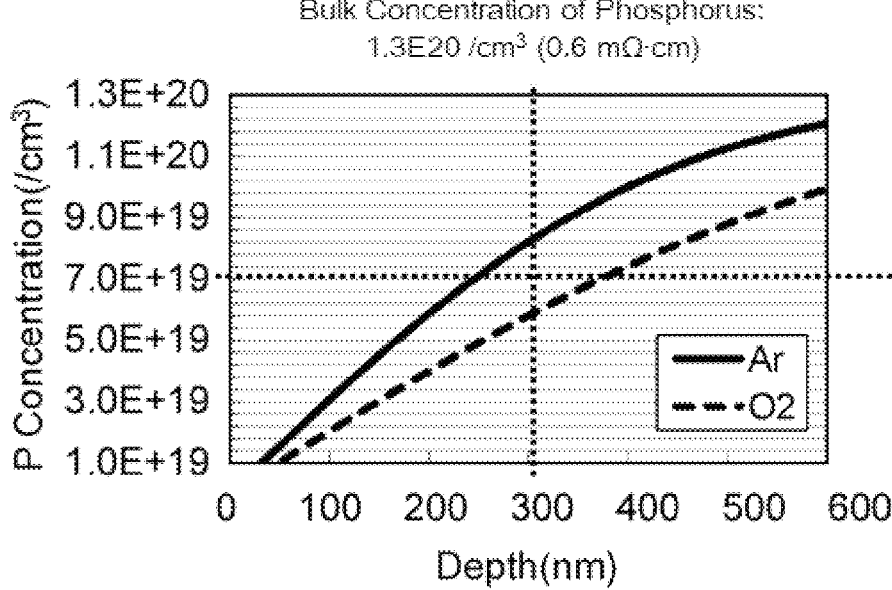
FIG. 5 shows the results of Experiment 5, illustrating the relationship of the density of phosphorus against the depth from the surface.

FIG. 5 is a result of the simulation of the concentration profile due to the heat treatment process. The boundary condition in the simulation is that the concentration of phosphorus at the substrate is $1.3 \times 10^{20}$ atoms/cm$^3$ and that at the uppermost surface is $1.0 \times 10^{17}$ atoms/cm$^3$. It is found that in the argon case, the concentration of phosphorus at 300 nm from the surface exceeds $7 \times 10^{19}$ atoms/cm, while in the case of O2, the concentration of phosphorus at a depth of 300 nm from the surface is $7 \times 10^{19}$ atoms/cm$^3$ or less due to the enhanced diffusion of phosphorus by the injection of interstitial silicon.

When the concentration of phosphorus is $7 \times 10^{19}$ atoms/cm$^3$ or less, because the size of Si—P defects is less than 100 nm and the density thereof is less than $1 \times 10^{12}$/cm$^3$, the number of LPDs is 200 or less, and thus the generation of Si—P defects is effectively inhibited.

What is claimed is:

1. A method for manufacturing a semiconductor silicon wafer with a silicon monocrystalline epitaxial layer, wherein a silicon monocrystalline epitaxial film with reduced SF is formed on the front surface side of a substrate sliced from a silicon single crystal ingot that is grown using the Czochralski method, the method comprising:

a step of manufacturing substrates, being doped with phosphorus, having resistivity being adjusted to be 1.05 mΩ·cm or less, a concentration of solid-solution oxygen of $0.9 \times 10^{18}$ atoms/cm$^3$ or less, and sliced such that the slicing angle against the primary plane orientation falls in a range of 0.1 degrees to 0.4 degree;

a step of forming a silicon oxide film with a thickness of at least 300 nm or thicker only on a backside of the silicon wafer substrate containing Si—P (silicon phosphorus) defects by the CVD method at a temperature of 500° C. or lower;

a step of heat treatment, after the step of forming a silicon oxide film, in which the substrate, only on the backside of which a silicon oxide film is formed, is kept in an oxidizing atmosphere at a constant temperature of more than 1100° C. or higher and 1250° C. or lower for 30 minutes or longer and 120 minutes or shorter such that for the substrate after the heat treatment in the oxidizing atmosphere, a thickness of a surface thermal oxide film formed on the surface of the substrate is 20 nm or more to 150 nm or less, and a concentration of phosphorus (P) to a depth of 300 nm from the substrate surface is $7 \times 10^{19}$ atoms/cm$^3$ or less;

a step of removal of a front surface oxide film, after the step of heat treatment, in which a thermal oxide film formed on the front surface of the substrate is removed, wherein the thickness of the CVD oxide film on the backside of the substrate remains at 300 nm or more after the step of removal of the surface thermal oxide film; and a step of deposition of a silicon monocrystalline epitaxial layer on the front surface of the substrate from which the oxide film is removed, after the step of removing the surface oxide film.

2. The method for manufacturing a semiconductor silicon wafer in claim 1, wherein the substrate manufactured from the silicon single crystal ingot contains Si—P defects that are formed by aggregation of phosphorus during the growth of the silicon single crystal ingot, a maximum side length of the Si—P defects is less than 100 nm, and a concentration of the Si—P defects is less than $1 \times 10^{12}$/cm$^3$.

* * * * *